(12) United States Patent
Luong et al.

(10) Patent No.: US 7,268,634 B2
(45) Date of Patent: Sep. 11, 2007

(54) DUAL-MODE VOLTAGE CONTROLLED OSCILLATOR USING INTEGRATED VARIABLE INDUCTORS

(75) Inventors: Howard Cam Luong, Kowloon (HK); Lai Kan Leung, Kowloon (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 10/927,785

(22) Filed: Aug. 27, 2004

(65) Prior Publication Data

US 2006/0055470 A1   Mar. 16, 2006

(51) Int. Cl.
*H03J 7/02* (2006.01)
(52) U.S. Cl. ..................... 331/36 L; 331/181
(58) Field of Classification Search ........... 331/181, 331/36 L
See application file for complete search history.

(56) References Cited

U.S. PATENT DOCUMENTS

| | | | | |
|---|---|---|---|---|
| 4,338,582 A | | 7/1982 | Presser ................ 333/175 |
| 5,473,291 A | * | 12/1995 | Brounley ............. 333/17.3 |
| 5,475,350 A | | 12/1995 | Yamada et al. ........ 333/223 |
| 5,691,677 A | | 11/1997 | De Maron et al. ..... 333/219.1 |
| 5,982,243 A | | 11/1999 | Pope .................. 331/59 |
| 5,994,982 A | | 11/1999 | Kintis et al. ........ 333/235 |
| 5,999,061 A | | 12/1999 | Pope et al. ........... 331/49 |
| 6,211,753 B1 | | 4/2001 | Leifso et al. ......... 333/214 |
| 6,255,913 B1 | | 7/2001 | Wang ................. 331/181 |
| 6,356,602 B1 | * | 3/2002 | Rodal et al. .......... 375/344 |
| 6,452,465 B1 | | 9/2002 | Brown et al. ......... 333/205 |
| 6,529,169 B2 | * | 3/2003 | Justice ............... 343/788 |
| 2005/0208917 A1 | * | 9/2005 | Roufoogaran et al. ... 455/296 |

* cited by examiner

*Primary Examiner*—Joseph Chang
(74) *Attorney, Agent, or Firm*—Heslin Rothenberg Farley & Mesiti P.C.

(57) ABSTRACT

A novel form of an integrated variable inductor uses an on-chip transformer together with a variable capacitor. The variable capacitor can either be a varactor or a switched capacitor array and is connected to the secondary coil of the transformer. By changing the capacitance at the secondary coil of a transformer, the equivalent inductance looking into the primary coil of the transformer can be adjusted. With another capacitor in parallel to the primary coil, two different modes of resonance inherently exist, and a very wide frequency tuning range can be achieved by combining the two modes.

8 Claims, 15 Drawing Sheets

DUAL-MODE VOLTAGE CONTROLLED OSCILLATOR USING INTEGRATED VARIABLE INDUCTORS

FIELD OF THE INVENTION

The present invention relates generally to variable inductors and, more particularly, to an integrated variable inductor using an on-chip transformer and a variable capacitor.

BACKGROUND OF THE INVENTION

Frequency tuning mechanisms are required in a wide range of different applications. For example they are required in wireless transceivers for the down conversion of signals at different frequencies, for multiple-band applications and for wide band applications. An ideal frequency tuning circuit will have a wide tuning range, be power efficient and have a high operating frequency.

Conventionally a tuning circuit includes an LC tank, and a conventional method of providing control of the tuning frequency is by using a variable capacitance such as a varactor to vary the value of C in the LC tank. Several classes of varactors, such as junction diodes and MOS capacitors, are commonly found. However, this arrangement has the disadvantage that there is a limited frequency range (about 10% only) owing to the limited capacitance ratio of the varactor. Also, because the power consumption of the LC tank is high, it is more power efficient to minimize the capacitance of the tank and to adjust the inductance for frequency variation. As a result, it is highly desirable to be able to implement integrated variable inductors.

Currently, several techniques are available for providing a variable inductance. These include active inductors and switched resonators. A typical design for an active inductor is the gyrator-C architecture, which employs a gyrator and an integrating capacitor. A gyrator consists of two transconductors connected in a feedback configuration, as shown in FIG. 1. This type of active inductor makes use of the parasitic capacitance of the transistors as the integrating capacitor. The inductance of active inductor is:

$$Z_{in}(j\omega) = \frac{g_{ds1} + j\omega(c_{gs2} + c_{gd1} + c_{gd2})}{(g_{m1} + g_{ds1} + j\omega c_{gd2})(g_{m2} + j\omega(c_{gs2} + c_{gd1}))}$$

Because only a few active devices are used in this type of inductor, the chip area occupied is usually very small. Tunability is another advantage of this type of active inductor. As shown in the above equation, by changing the bias and, therefore, the transconductance of the transistors, the inductance of the active inductor can be varied.

However, the power consumption and noise contribution of the active devices used in these inductors are generally too high to be practical, and the dynamic range is quite limited. Most important of all, active inductors are generally not suitable for high frequency operation. At high frequencies, the performance of the active inductor is degraded by the phase errors induced by parasitics.

Recently, switched resonators using multiple inductors have been introduced. A switched resonator typically comprises two spiral inductors and a switching transistor, either connected in parallel or in series with the inductors as shown in FIG. 2. If the switching transistor is connected in parallel with one of the inductors, the inductor is shorted when the switch is on. As a result, the equivalent inductance reduces from $L_1+L_2$ to $L_1$.

A switched resonator can be used for coarse tuning and another varactor can be used for fine tuning. The tuning range of the resonator can therefore be significantly improved. However, the turn-on resistance of the switching transistor has a great impact on the quality factor of the resonator. It is necessary to increase the size of the transistor in order to reduce the effect of the turn-on resistance on the quality factor. Since the operating frequency of the resonator depends on the equivalent inductance and the capacitance between drain and ground of the switching transistor, the drain capacitance of the switch significantly reduces the operating frequency of the resonator. Thus, this type of switched resonator is not suitable for applications with low noise, low power, and high frequency.

It is also possible to frequency tune some types of resonators by mechanically changing a property of these resonators. However, this is not feasible if the resonator is to be integrated on chip.

Thus, it is desirable to provide a variable inductance that is suitable for high frequency circuits and has reduced power consumption and reduced noise degradation.

SUMMARY OF THE INVENTION

According to the present invention there is provided a variable inductor comprising a transformer having primary and secondary coils, wherein a variable capacitance is provided in parallel with said secondary coil. By changing the capacitance at the secondary coil of a transformer, the equivalent inductance looking into the primary coil of the transformer can be adjusted.

In exemplary embodiments of the invention, the variable capacitance may be provided by a varactor or a switched capacitor array, for example.

In another aspect of the present invention, a capacitance is also provided in parallel with the primary coil. With another capacitor in parallel to the primary coil, two different modes of resonance inherently exist, and a very wide frequency tuning range can be achieved by combining the two modes. This capacitance may be a fixed capacitor or simply parasitic capacitance of the primary coil in various embodiments of the invention. In another embodiment, the capacitance in parallel with the primary coil is a variable capacitance.

In another aspect of the invention, the primary and secondary coils may be coupled together by a mutual inductance.

In accordance with yet another aspect of the invention, a voltage controlled oscillator includes a variable inductor comprising a transformer having primary and secondary coils, wherein a variable capacitance is provided in parallel to said secondary coil.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS OF THE INVENTION

Figure 1:
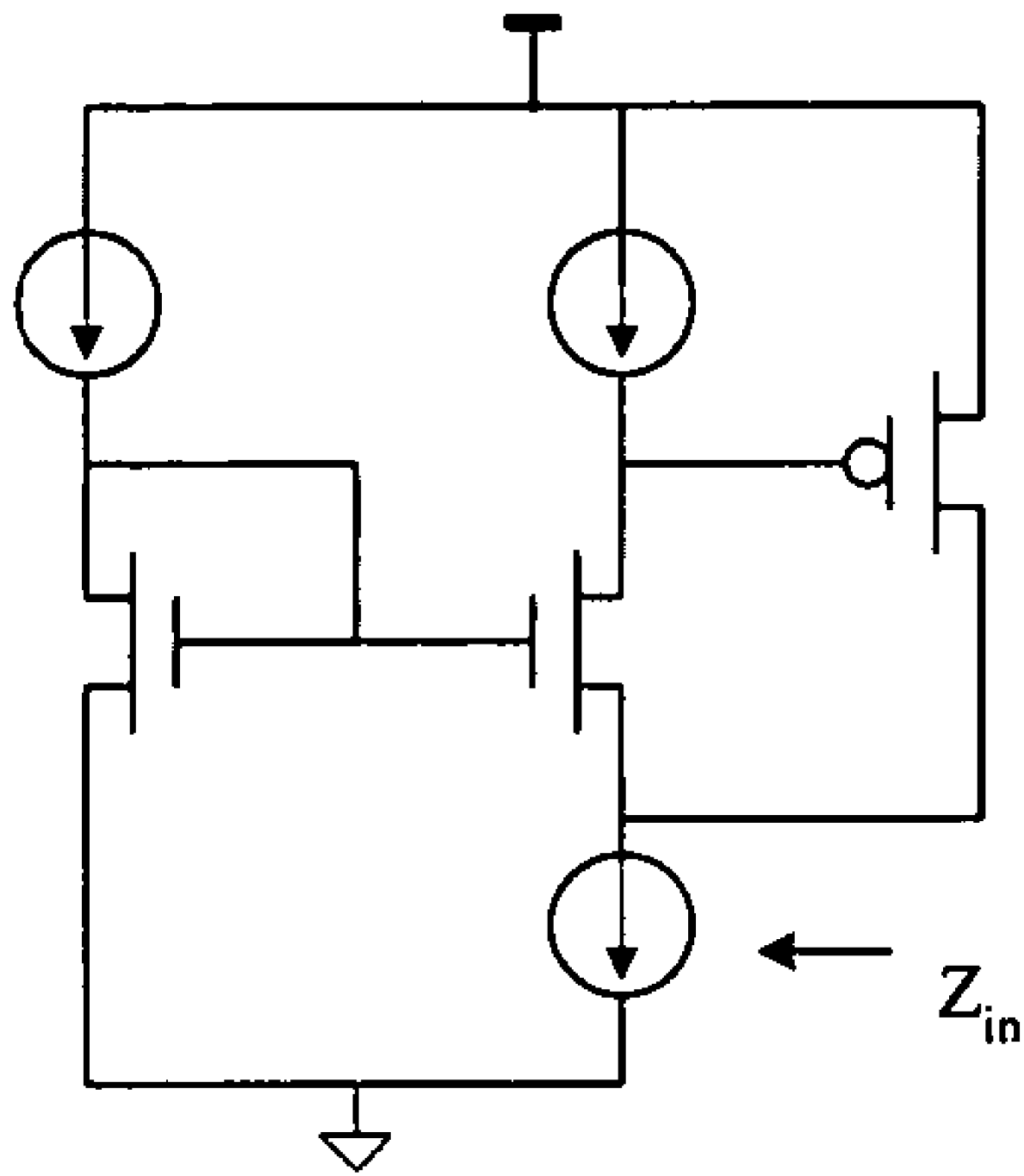
FIG. 1 shows a prior art active inductor.
Figure 2:
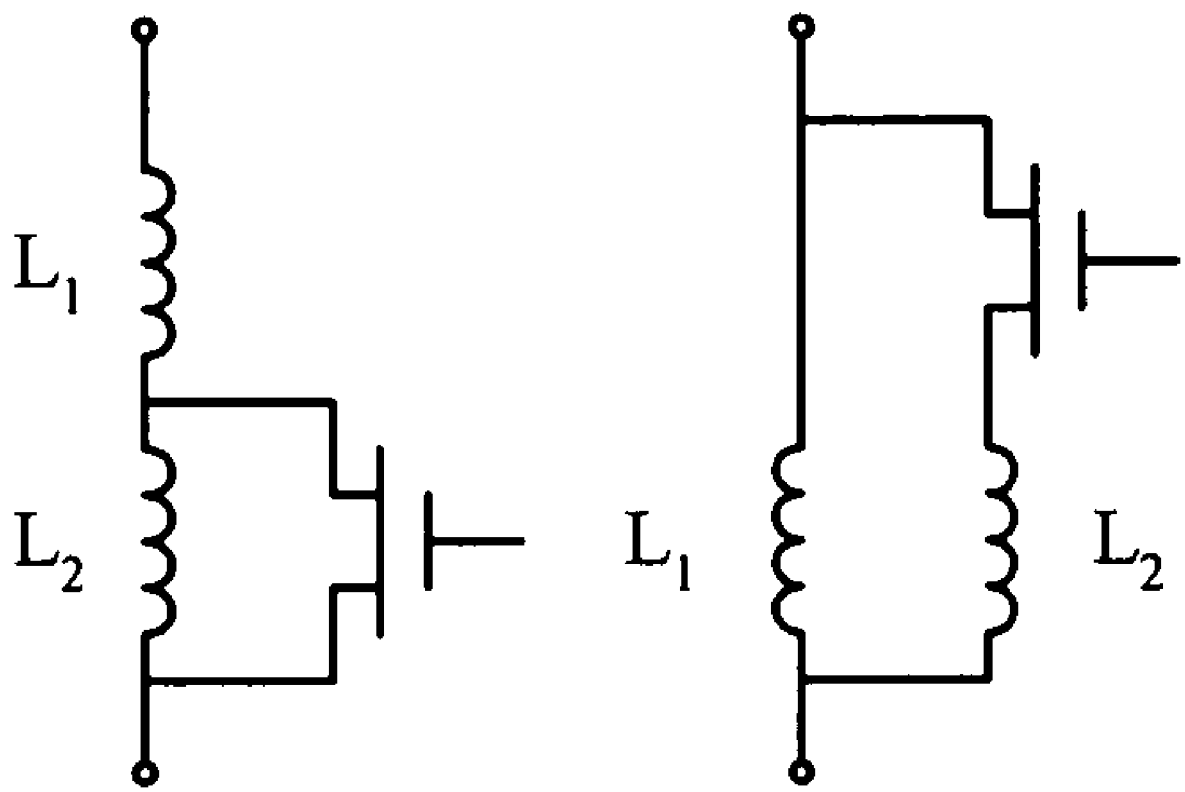
FIG. 2 shows prior art switched resonators.
Figure 3:
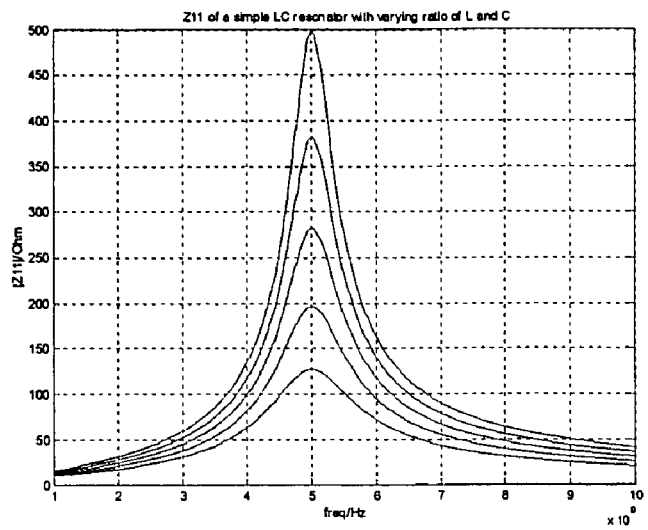
FIG. 3 shows the impedance of a simple LC resonator with a varying ratio of L and C.

FIG. 3 shows the impedance of a simple LC resonator when the ratio of the L and C is varied and the resonant frequency is kept unchanged. For such an LC oscillator, if the value of L increases, the impedance of the tank also increases. Then, less ac current and, therefore, less dc power is required to attain the same output amplitude. In other words, in order to reduce the power consumption, it is advantageous to maximize the inductance, or, to minimize the capacitance in an LC tank.

Moreover, for an inductor with a series resistance of $r_s$, the parallel resistance of the inductor is $$\frac{\omega^2 L^2}{r_s}.$$

For an oscillator, in order to start up oscillation, the following condition has to be fulfilled, $$\frac{G_m \omega^2 L^2}{r_s} = 1$$

Assuming that the quality factor of the inductor remains almost the same for different frequencies, when L increases, $G_m$ decreases and the power consumption can be reduced.

Conventionally, frequency tuning is achieved by changing the capacitance of a tank using varactor. However, as mentioned before, it is more power efficient to minimize the capacitance of the tank and adjust the inductance for frequency variation. Therefore, the need for a variable inductor arises.

Figure 4:
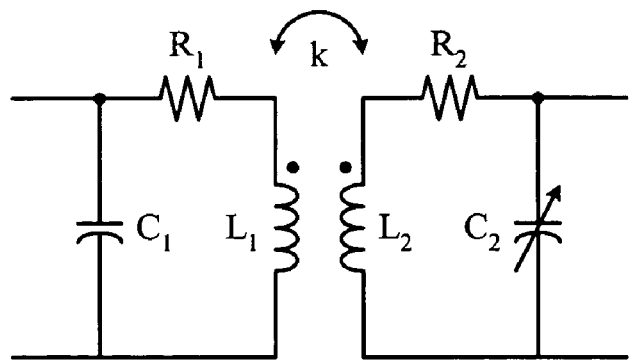
FIG. 4 shows a schematic of a variable inductor according to an embodiment of the invention.
Figure 5:
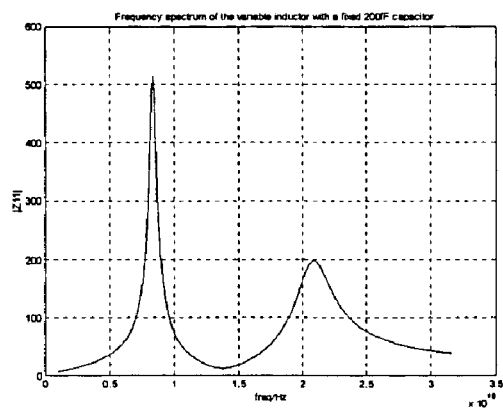
FIG. 5 shows an example of the frequency response of a resonator consisting of a variable inductor and a capacitor according to an embodiment of the invention.

FIG. 4 shows the schematic of a variable inductor according to an embodiment of the present invention. In this embodiment the variable inductor comprises a transformer with two capacitors. $C_1$ is the capacitor connected to the primary coil and $C_2$ is the other capacitor connected to the secondary coil. $C_1$ can either be the parasitic capacitance, a fixed capacitor, or a varactor, whereas $C_2$ can be a varactor or a switched capacitor array. By changing the capacitance of $C_2$, the equivalent inductance looking into the primary coil of the transformer can be tuned. FIG. 5 shows an example of the frequency response of a resonator consisting of a variable inductor and a fixed capacitance.

With this embodiment of the invention there are two modes of frequency tuning: frequency tuning in a single mode, and frequency tuning by mode-switching. Together with its own parasitic capacitance, the primary coil will resonate at different frequencies, which are determined by the value of the capacitance at the secondary coil. By connecting another varactor at the primary coil, the frequency tuning range can be further extended to be much larger than that can be achieved with existing solutions with variable capacitors.

It has also been shown by theory, simulation, and experiments that there exist two different resonant modes associated with the proposed variable inductor. The tuning range of the invention can be greatly increased by combining two modes. Since the variable inductor of the preferred embodiments only comprises passive components, no power consumption is required which is highly advantageous.

Figure 6:
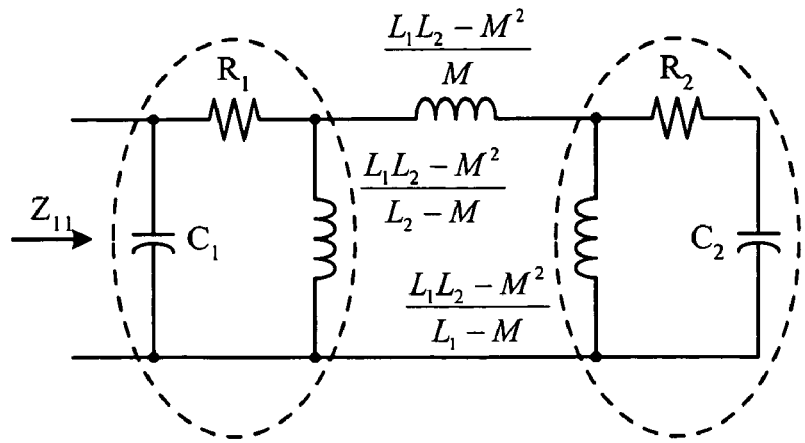
FIG. 6 shows a variable inductor using π model.

In order to explain the two resonant frequencies and the mode-switching property of the transformer intuitively, the π model can be used as shown in FIG. 6.

The two LC tanks with two different resonant frequencies shown in FIG. 6 are coupled to each other by the mutual inductance, $$\frac{L_1 L_2 - M^2}{M}.$$

Hence, it can be concluded that two resonant frequencies are inherent in a transformer.

Figure 7:
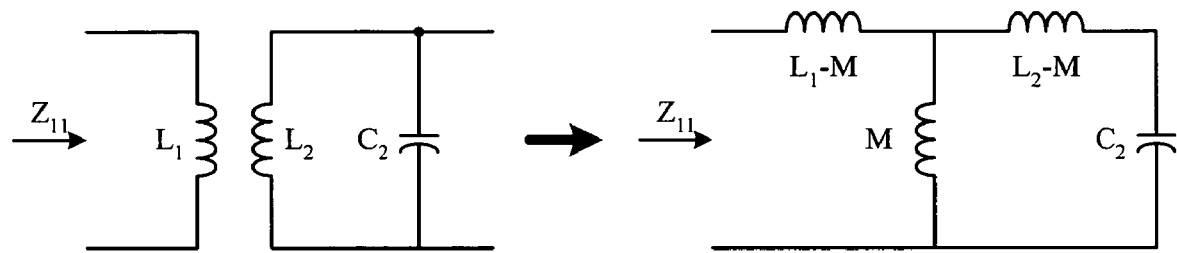
FIG. 7 shows a T-model representation of a variable inductor.

The ideal case is considered first. Lumped components without resistive loss are used for the analysis here. A T-model, as shown in FIG. 7, is used for the analysis. Its input impedance, $Z_{11}$, can be calculated as shown below:

$$Z_{11} = s\left(L_1 + \frac{\omega^2 k^2 L_1 L_2 C_2}{1 - \omega^2 L_2 C_2}\right) = sL_{\mathit{eff}}$$

where
$$\begin{cases} L_{\mathit{eff}} = L_1 + \frac{\omega^2 k^2 L_1 L_2 C_2}{1 - \omega^2 L_2 C_2} = L_1 + \frac{\omega^2 k^2 L_1}{\omega_2^2 - \omega^2} \\ \omega_2 = \frac{1}{\sqrt{L_2 C_2}} \end{cases} \quad (1)$$

Five properties of the variable inductor can be derived from the above equation:
1. When $\omega \to 0$ or $C_2 \to 0$, $L_{\mathit{eff}} = L_1$
2. When $\omega \to \infty$ or $C_2 \to \infty$, $L_{\mathit{eff}} = L_1(1-k^2)$
3. When $\omega = \omega_2$, $L_{\mathit{eff}} \to \infty$
4. When $\omega \to \omega_2^+$, $L_{\mathit{eff}} > 0$
5. When $\omega \to \omega_2^-$, $L_{\mathit{eff}} < 0$ $L_{\mathit{eff}}$ will reach the largest value when $$\omega = \omega_2 = \frac{1}{\sqrt{L_2 C_2}}.$$

In practice, the largest value of $L_{\mathit{eff}}$ cannot be infinite because there is lossy component in the variable inductor, which is not included here, but will be revisited in the later analysis.

Thus, it can be concluded that the input impedance of an embodiment of the present invention is inductive and can be represented by the above equation. By changing the value of $C_2$, the values of the equivalent inductance can be adjusted accordingly. $C_2$ can either be a varactor or a switched capacitor array.

Figure 8:
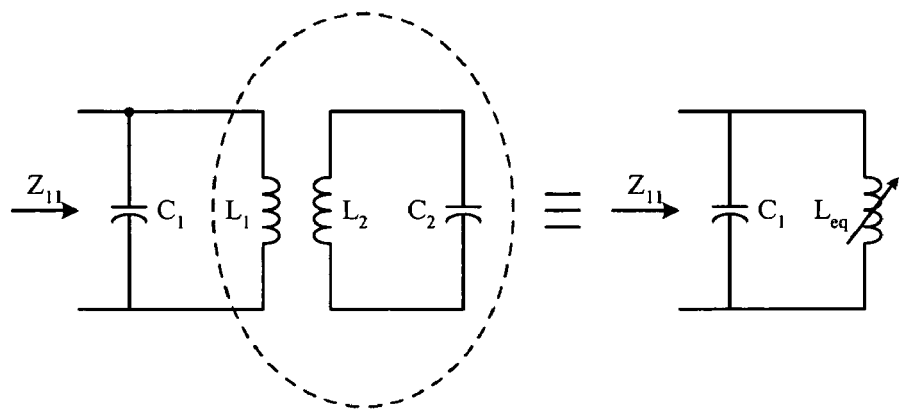
FIG. 8 shows a resonator with a variable inductor according to an embodiment of the invention.

If the variable inductor is connected to a capacitor in parallel, as shown in FIG. 8, a resonator with tunable resonant frequency can be implemented. The following equations can then be derived from FIG. 8:

$$\begin{cases} L_{\mathit{eff}} C_1 = \frac{1}{\omega_0^2} \\ L_{\mathit{eff}} = L_1 + \frac{\omega_0^2 k^2 L_1 L_2 C_2}{1 - \omega_0^2 L_2 C_2} \end{cases}$$

$$\Rightarrow \omega_0 = \sqrt{\frac{(\omega_1^2 + \omega_2^2) \pm \sqrt{(\omega_1^2 - \omega_2^2)^2 + 4k^2 \omega_1^2 \omega_2^2}}{2(1-k^2)}} \quad (2)$$

where $L_1 C_1 = \frac{1}{\omega_1^2}$ and $L_2 C_2 = \frac{1}{\omega_2^2}$

Since $(L_1 C_1 - L_2 C_2)^2 + 4k^2 L_1 L_2 C_1 C_2 > 0$, there are always two resonants frequencies.

Similarly, the equivalent inductance in the resonator can be derived as shown below, $$L_{\mathit{eff}} = \frac{L_2 C_2 + L_1 C_1 \pm \sqrt{(L_2 C_2 - L_1 C_1)^2 + 4k^2 L_1 C_1 L_2 C_2}}{2 C_1} \quad (3)$$

Since $(L_1 C_1 - L_2 C_2)^2 + 4k^2 L_1 L_2 C_1 C_2 > 0$, there are two values of $L_{\mathit{eff}}$, which correspond to the two resonant frequencies derived previously.

Figure 9:
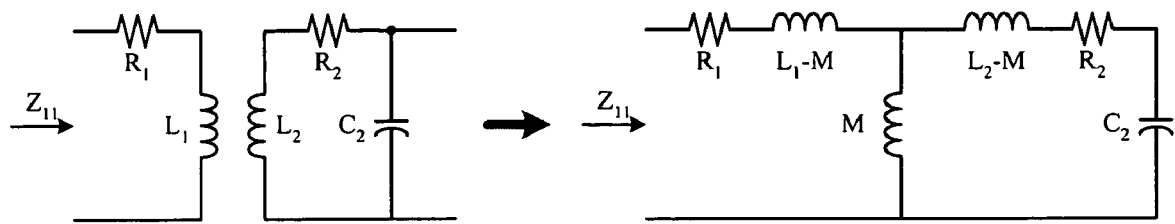
FIG. 9 shows a T-model representation of a variable inductor according to an embodiment of the invention with resistive components.

Lumped components with resistive loss are used for the further analysis. A T-model, as shown in FIG. 9, is used for the analysis. The input impedance, $Z_{11}$, can be calculated as shown below:

$$Z_{11} = r_{\mathit{eff}} + sL_{\mathit{eff}}$$

where
$$\begin{cases} r_{\mathit{eff}} = r_1 + \frac{\omega^4 C_2^2 r_2 k^2 L_1 L_2}{(1-\omega^2 L_2 C_2)^2 + \omega^2 C_2^2 r_2^2} \\ L_{\mathit{eff}} = L_1 + \frac{\omega^2 k^2 L_1 L_2 C_2 - \omega^4 C_2^2 k^2 L_1 L_2^2}{(1-\omega^2 L_2 C_2)^2 + \omega^2 C_2^2 r_2^2} \\ \phantom{L_{\mathit{eff}}} = L_1 + \frac{\omega^2 k^2 L_1 L_2 C_2 (1 - \omega^2 L_2 C_2)}{(1-\omega^2 L_2 C_2)^2 + \omega^2 C_2^2 r_2^2} \end{cases} \quad (4)$$

Figure 10:
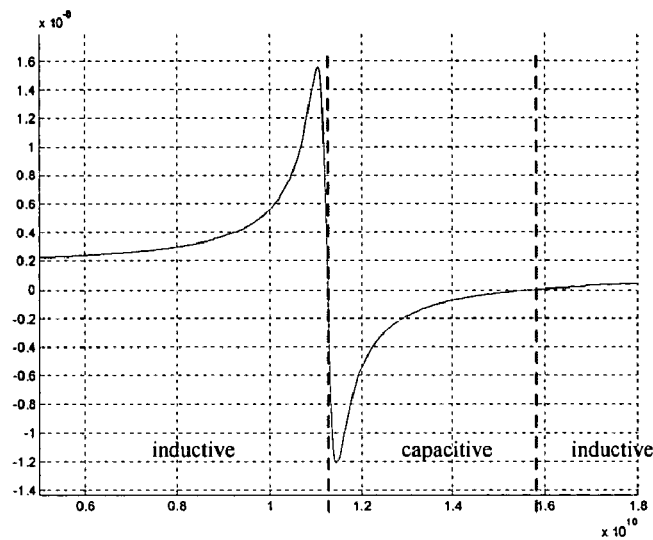
FIG. 10 shows an example of the inductance against frequency in an embodiment of the invention using the T-model representation of FIG. 9.
Figure 11:
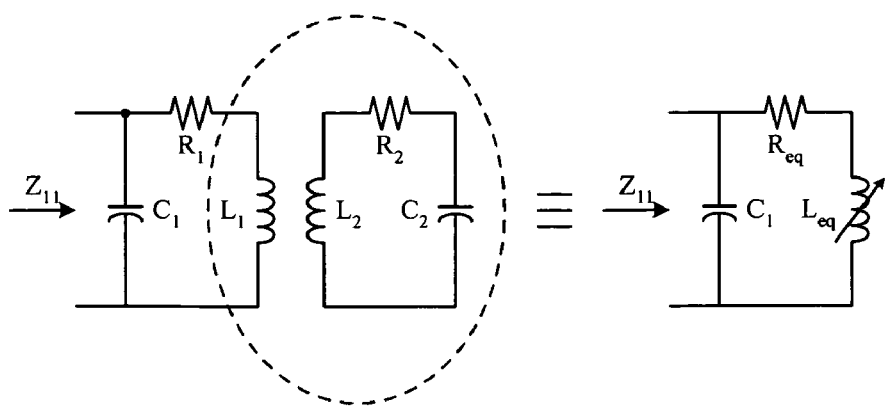
FIG. 11 shows a resonator with a variable inductor according to an embodiment of the invention with resistive components.

FIG. 10 shows an example of the variable inductance against frequency using the model with resistive components. There are three regions of operation. Two of them are inductive and one of them is capacitive. To use the present embodiment of the invention as a variable inductor, it is necessary to operate the embodiment in the inductive regions. If the variable inductor is connected to a capacitor in parallel, as shown in FIG. 11, a resonator with tunable resonant frequency can be implemented. The effect of the resistive components is considered in the analysis below.

The following equation can then be derived from FIG. 11:

$$L_{\mathit{eff}} = L_1 + \frac{\omega^2 k^2 L_1 L_2 C_2 (1 - \omega^2 L_2 C_2)}{(1-\omega^2 L_2 C_2)^2 + \omega^2 C_2^2 r_2^2} \quad (5)$$

$$\omega = \frac{1}{\sqrt{L_{\mathit{eff}} C_1}} \quad (6)$$

Figure 12:
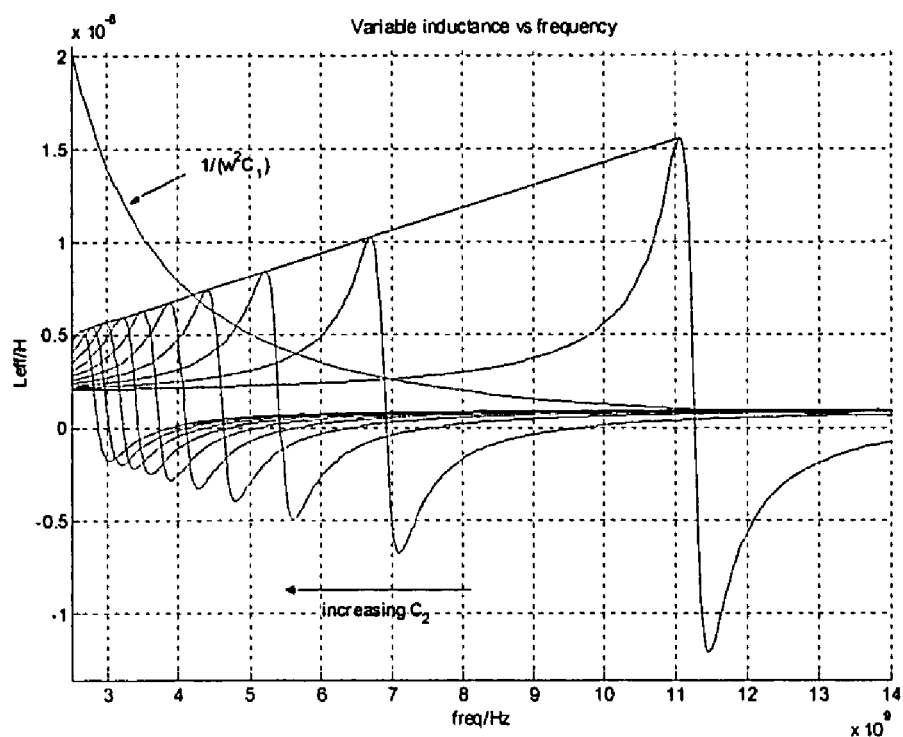
FIG. 12 shows a graphical representation of Equation (5)
Figure 13:
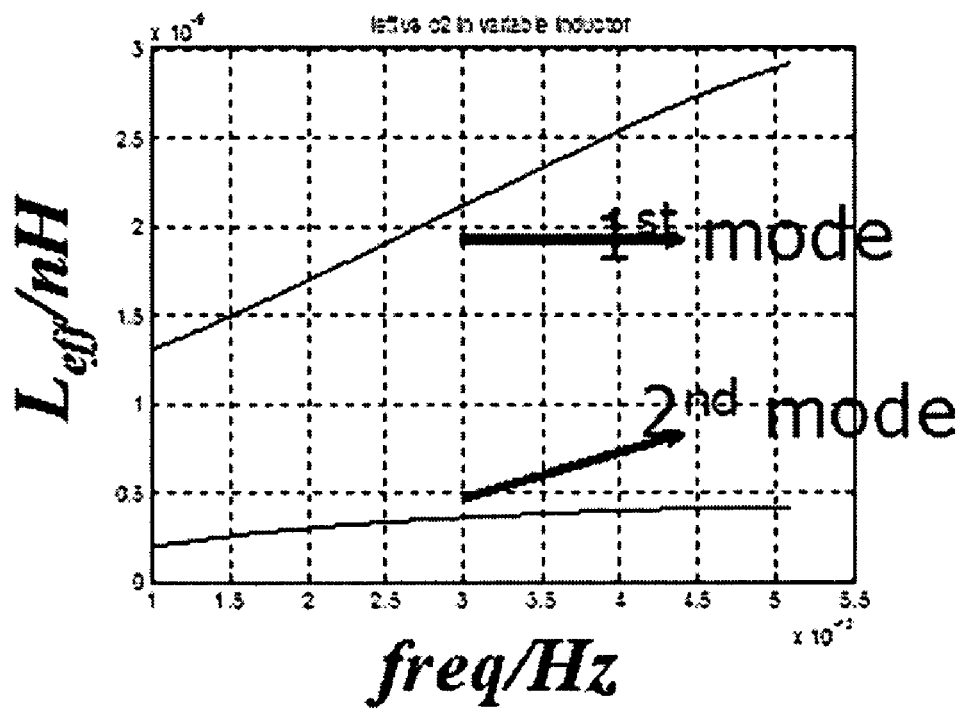
FIG. 13 shows the effective inductance of an embodiment of the present invention against $C_2$.

It is easier to solve the above equations using a graphical method. As an example, different curves of variable inductance against frequency with different values of $C_2$, represented by equation (5) are shown in FIG. 12. The intersecting points correspond to the roots of equation (5) An example of the effective inductance against the values of $C_2$ is shown in FIG. 13.

The corresponding $Z_{11}$ of the resonator with the same variable inductor and the same value of $C_1$ is also plotted. This is aligned with FIG. 12 and shown in FIG. 14. By comparing both figures, it can be seen that the intersecting points locate at the same frequency, at which the maximum values of $Z_{11}$ of the resonator locate. This is the resonant frequency where the inductive component of the variable inductors cancels exactly with the capacitance, $C_1$.

Figure 14:
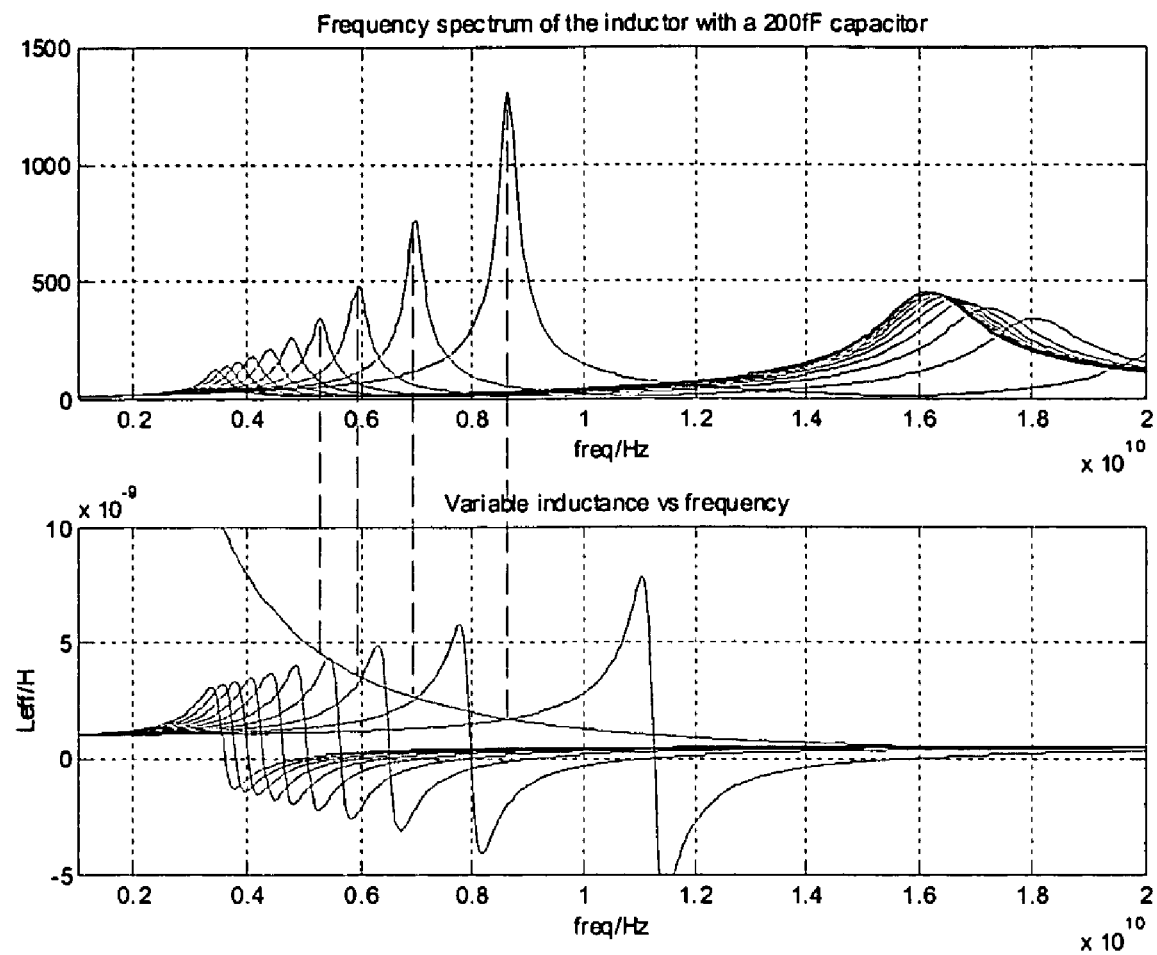
FIG. 14 shows the curves of FIG. 12 aligned with the corresponding $Z_{11}$.

By referring to FIG. 14, it can be seen that there are more than one intersecting point for each set of curves. This implies that more than one mode of resonance are available with an embodiment of the invention. It can be seen that, in the second mode, the intersecting points locate at the same frequency, at which the second peaks of $Z_{11}$ of the resonator locate. This is the resonant frequency where the inductive component of the variable inductors cancels exactly with the capacitance, $C_1$, in the second mode of resonance.

As mentioned before, this phenomenon can be explained intuitively by FIG. 6, which shows the representation of an embodiment of the present invention using the $\pi$ model. In FIG. 6 the two LC tanks coupled to each other by the mutual inductance explain the two inherent resonant frequencies in the embodiment of the invention. This property can be applied to an oscillator for a wide-band voltage-controlled oscillator.

Figure 15:
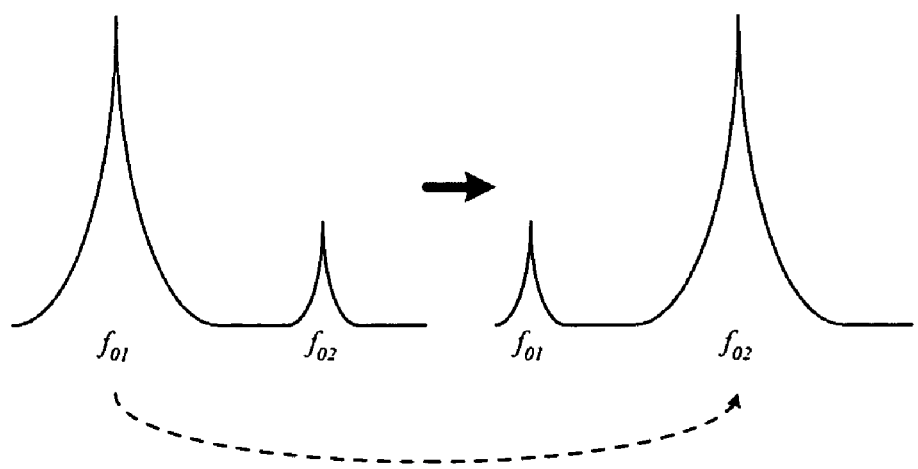
FIG. 15 illustrates the switching of the maximum input impedance in an oscillator using an embodiment of the invention.

In an oscillator, a resonant tank should be combined with an active circuit, which is used to cancel the resistive loss of the resonant tank. By combining with the active circuit, oscillation will start at the frequency with the higher quality factor, which requires less energy to start oscillation. By making use of the two inherent resonant frequencies in embodiments of the present invention, the oscillator can switch from one mode of oscillation to another. This can be achieved by changing the values of C2 in the current invention, which adjusts the resonant frequency, as well as, the maximum values of the impedance in each mode. When $C_2$ increases beyond a particular value, there is a swap in the maximum value of the impedance. This is illustrated in FIG. 15.

An embodiment of the present invention may be compared with a simple LC tank. In a first comparison, both an embodiment of the current invention and a simple inductor are connected with a 1 p-10 pF capacitor and the value of the inductance, $L_1$, in the embodiment of the invention is the same as the inductance in the simple LC tank. The maximum resonant frequency of the simple LC tank is 5.6 GHz, whereas the maximum resonant frequency of the tank with the variable inductor according to an embodiment of the invention is around 19 GHz. Next, the capacitor in the simple LC tank is reduced by four times to attain a similar resonant frequency to the resonator comprised of the embodiment of the present invention. It can be seen that, although the simple LC tank can achieve resonant frequency close to that formed by an embodiment of the present invention, the magnitude of the simple resonant tank is still only 70% of the tank with the variable inductor. The increase in the magnitude is due to coupling of the coils in transformer. Since the present invention consists of coupled resonators, the invented variable inductor has a quality factor being 1+k times larger than that of a simple LC tank. At 11.2 GHz, the Q of the tank with the variable inductor is 11.4, whereas the Q of the tank with the simple LC tank is only 7.4, which is only 65% of the variable inductor. Besides the increase in the magnitude, the resonator according to an embodiment of the invention also has two modes of resonance, compared to the single mode of resonance in the simple LC tank.

Figure 16:
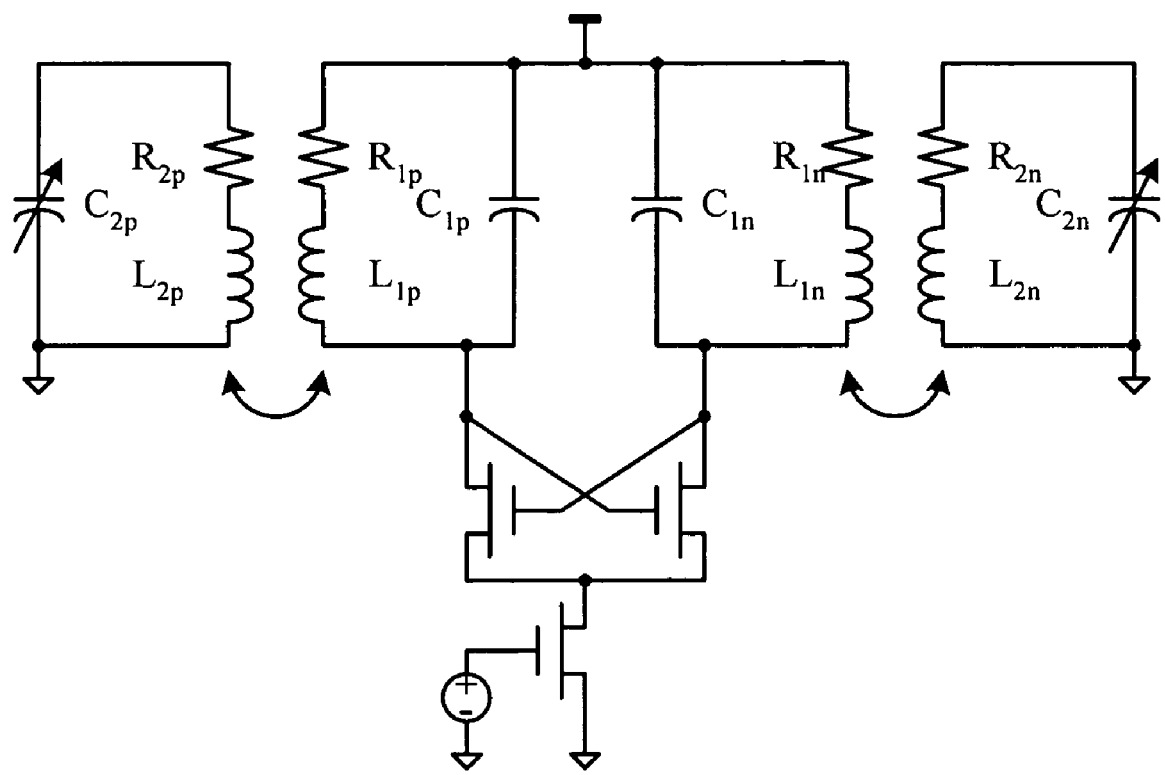
FIG. 16 shows a schematic of a voltage-controlled oscillator with an embodiment of the present invention.
Figure 17:
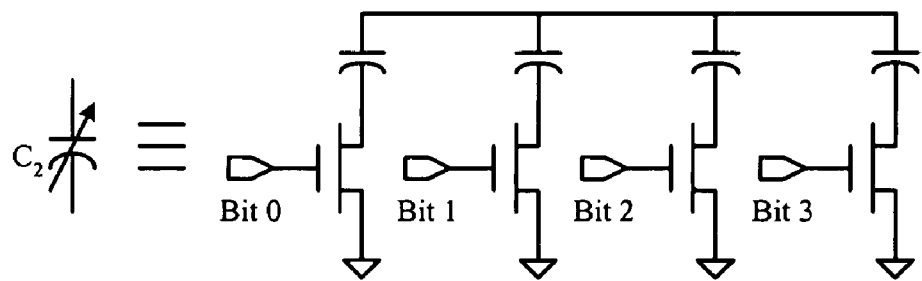
FIG. 17 shows details of the capacitors $C_{2p}$ and $C_{2n}$ shown in FIG. 16.

An example of a voltage-controlled oscillator is designed using an embodiment of the present invention is shown in FIGS. 16 and 17. The transistors in the oscillator are the active circuit called the negative-$g_m$ cell, which is used to cancel the resistive components of the resonator. The VCO is designed with a differential configuration. This requires a four-port transformer. This is feasible with only simple layout by using symmetrical and center-tapped transformer.

Figure 18:
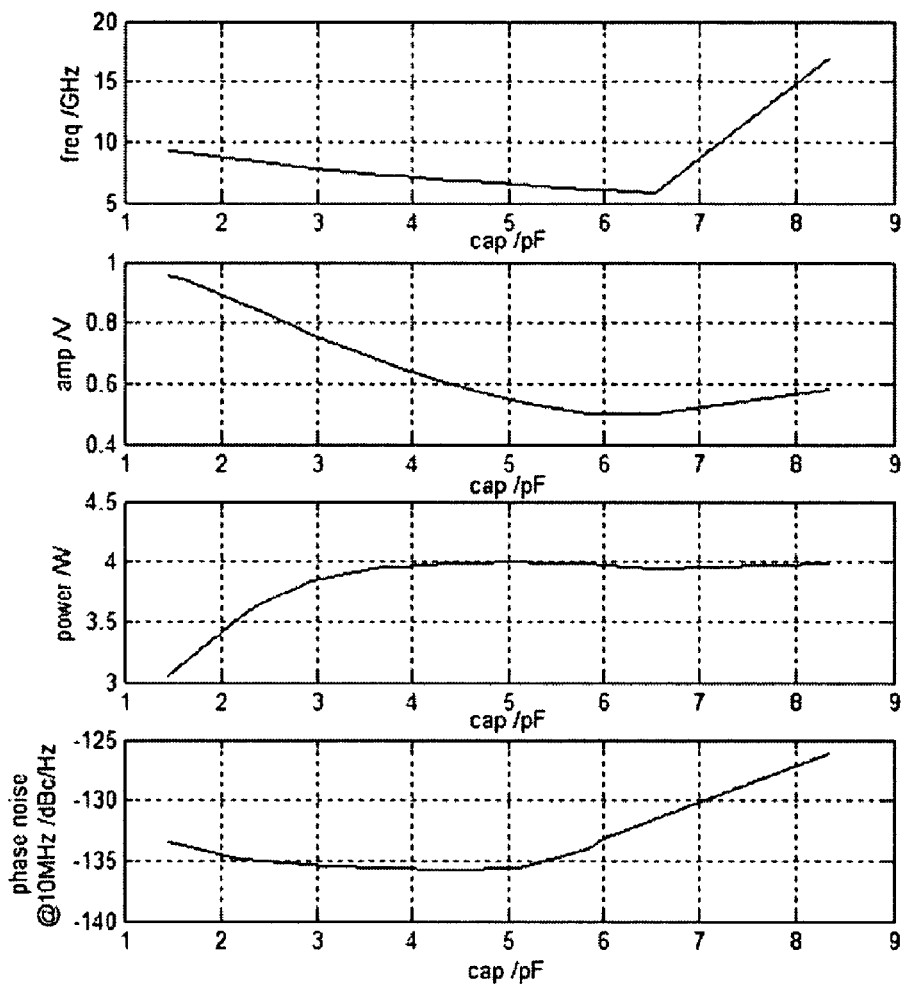
FIG. 18 shows simulation results of the voltage-controlled oscillator of the embodiment of FIG. 16, FIG. 19 compares the performance of a VCO formed in accordance with an embodiment of the invention with the prior art.

The simulation results are shown in FIG. 18. Simulated oscillation frequency, phase noise and the power consumption against the value of $C_2$, are shown in the figure. The oscillation frequency decreases when the value of $C_2$ increases. The change in $C_2$ is achieved by a 4-bit switched capacitor array. As mentioned before, there should be two modes of resonance. This can be verified by the large increase in frequency when the value of $C_2$ is tuned from 5 pF to 8 pF. The results are summarized in Table 1 below. Due to the tuning in a single mode and the switching of resonant frequency, the oscillator can be tuned from 5.8 GHz to 17 GHz (98%).

TABLE 1

Summary of the simulation results and the comparison with simple LC tank

| Structure | Variable inductor | Simple LC tank w/same power | Simple LC tank w/large power |
|---|---|---|---|
| Process | TSMC 0.18 μm | | |
| Supply voltage N | 1 | | |
| Frequency/GHz | 5.8-17 | 4.2-4.5 | 1.9-3.6 |
| Tuning range | 98% | 7% | 60% |
| Amplitude(single-ended)/V | 0.5-0.9 | 0.26-0.56 | 0.5-1.6 |
| Power/mW | 3.1-4.0 | 3.8-3.9 | 17.7-19.8 |
| Phase nosie/dBc@10 MHz | −126−−136 | −128−−133 | −143−−137 |

The tuning range of this design is much larger compared to that achievable with existing state-of-the-art designs, which is usually limited to less than 20%. In order to achieve such a wide tuning range, only a ring oscillator can be used, but it has much inferior performance in terms of frequency, phase noise, and power consumption.

Figure 19:
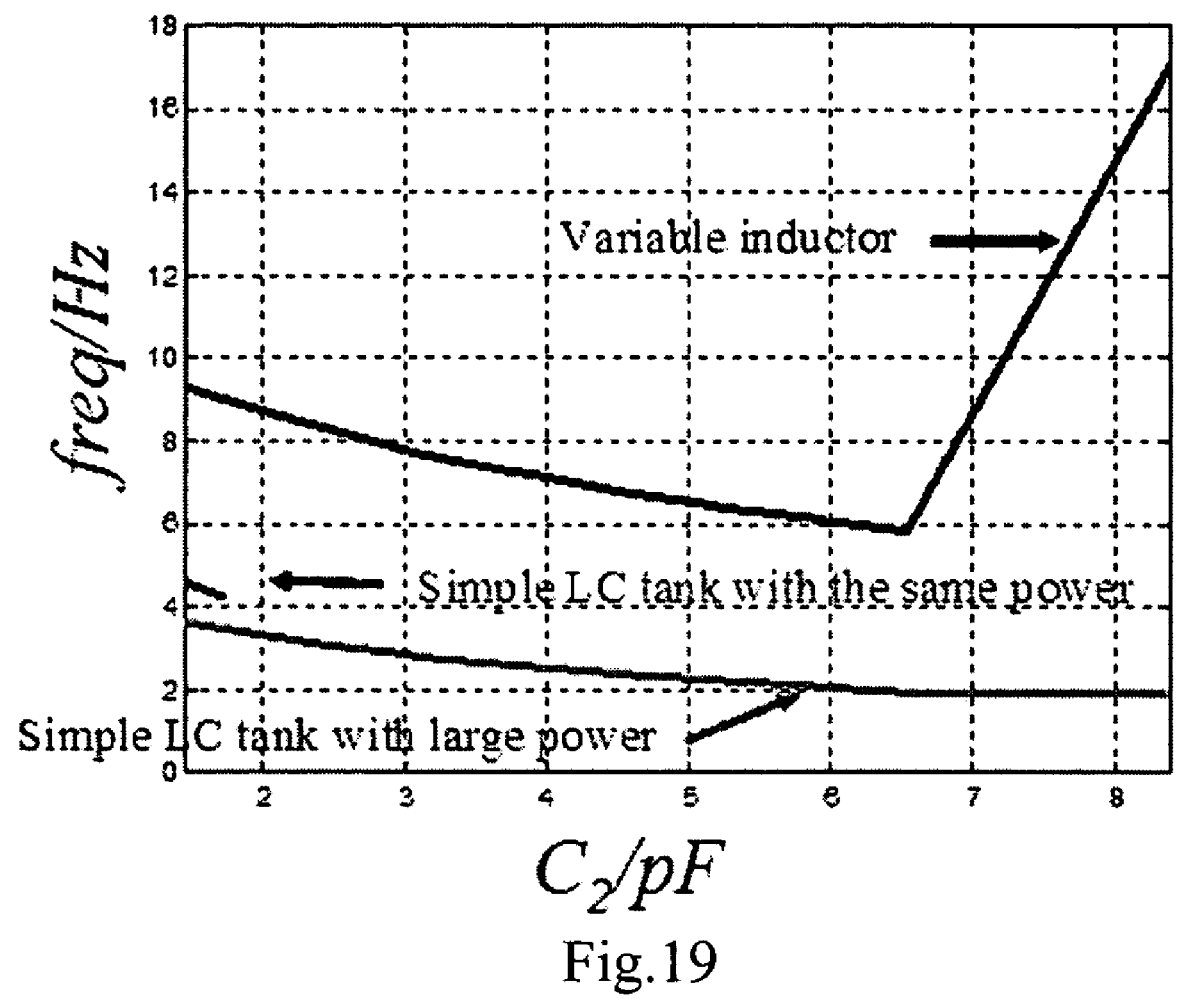

Comparison with VCOs using simple LC tanks is also implemented in simulation. The performance of the VCOs is shown in FIG. 19 and summarized in Table 1. With the similar power consumption, the tuning range for the simple LC tank is only 7%. By increasing the power consumption, the tuning range can be increased to 60%.

Three testing setups were designed to demonstrate the characteristics of embodiments of the invention. They are:
1. Testing setup using coupled microstrip lines.
2. Testing setup using on-chip transformer and off-chip capacitor.
3. Fabrication of a CMOS VCO using on-chip transformer and on-chip capacitors.

Figure 20:
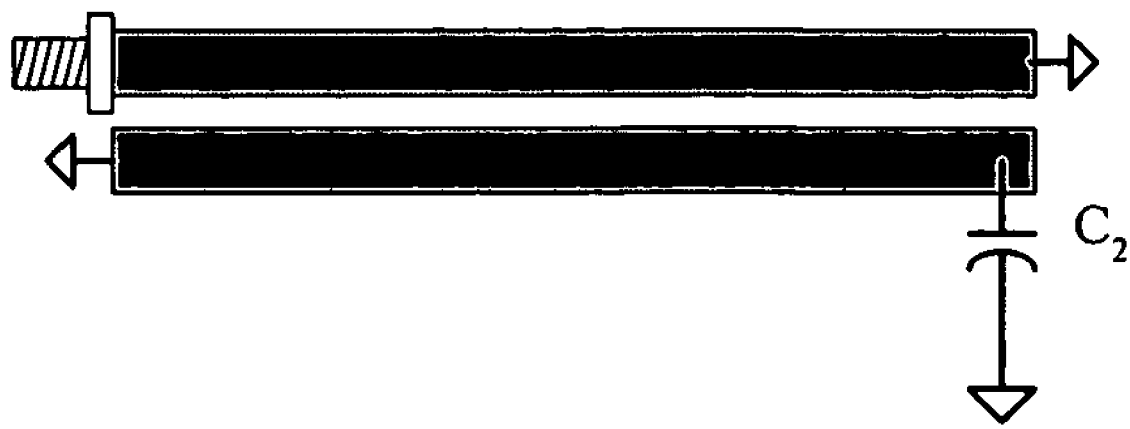
FIG. 20 shows a testing setup using coupled microstrip lines.
Figure 21:
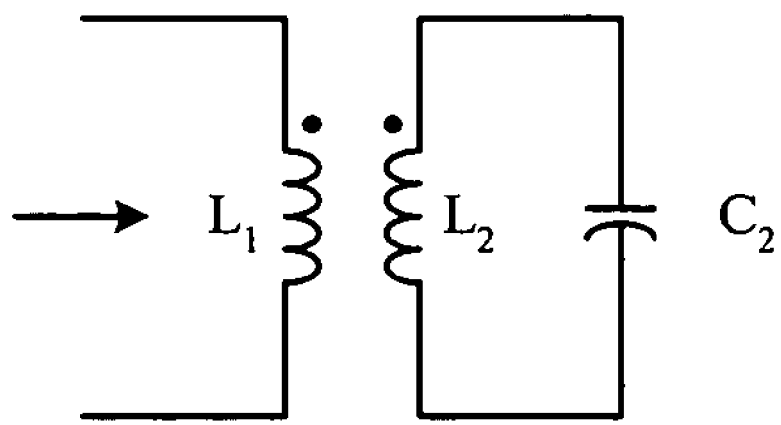
FIG. 21 shows the lumped model of the microstrip lines in FIG. 20

The purpose of the first testing setup, as shown in FIG. 20, is to demonstrate the functionality of embodiments of the invention by off-chip components. The lumped element model of the coupled microstrip lines is shown in FIG. 21. By changing the values of $C_2$, the equivalent inductance of the testing setup is adjusted, which is the same as in the current invention.

In this setup, a pair of coupled microstrip lines and shunt capacitors are used to synthesize two coupled resonators with two different resonant frequencies. The two microstrip lines are shorted to ground. A terminal of one of the microstrip lines is soldered to a SMA connector for connection with testing equipments.

Figure 22:
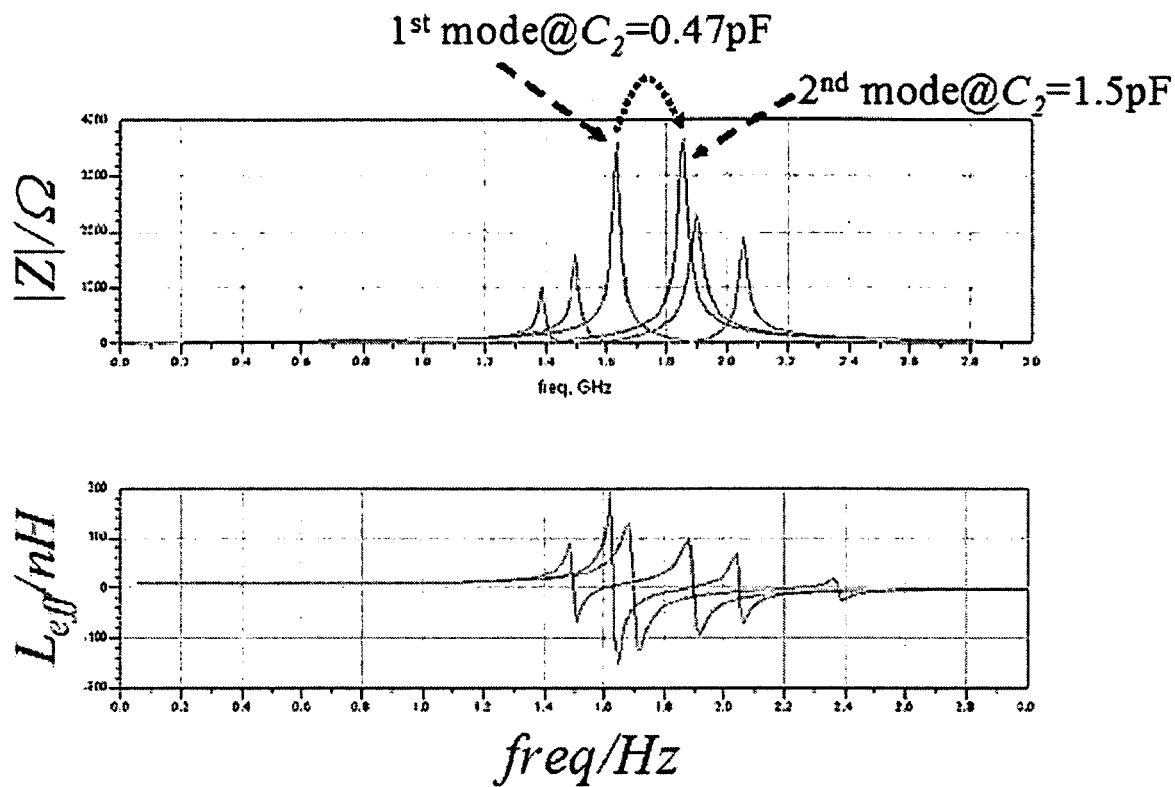
FIG. 22 shows the measurement results of the coupled microstrip lines.

A network analyzer, 8720ES, is used to measure the S-parameters of the embodiment of the invention when the capacitor is changed from 0.47 pF to 1.5 pF. $S_{11}$ is then converted to $Z_{11}$. The plot of the measured $Z_{11}$ and the corresponding plot of the equivalent inductance against frequency with different values of $C_2$ are shown in FIG. 22.

Figure 23:
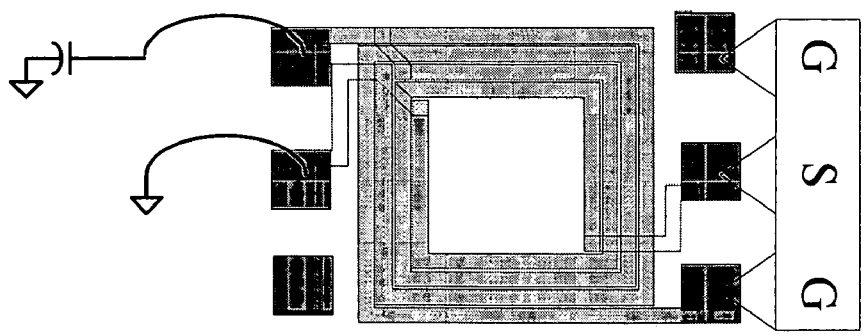
FIG. 23 shows a testing setup for obtaining $Z_{11}$ of circuits according to an embodiment of the invention.

The purpose of the second testing setup, shown in FIG. 23, is to demonstrate the utility of an embodiment of the present invention using an on-chip transformer. Since an on-chip variable capacitor is not available, the secondary coil of the on-chip transformer is connected to a capacitor using bondwire. The turn ratio of the on-chip transformer is 1:2. The capacitor used is an off-chip surface mount capacitor. By changing the off-chip capacitor, the equivalent inductance of the testing setup is adjusted, which is the same as in an embodiment of the current invention. Silver paint is used to attach the surface mount capacitor on a pad in the PCB. The same pad is connected to the on-chip transformer using bondwire.

Figure 24:
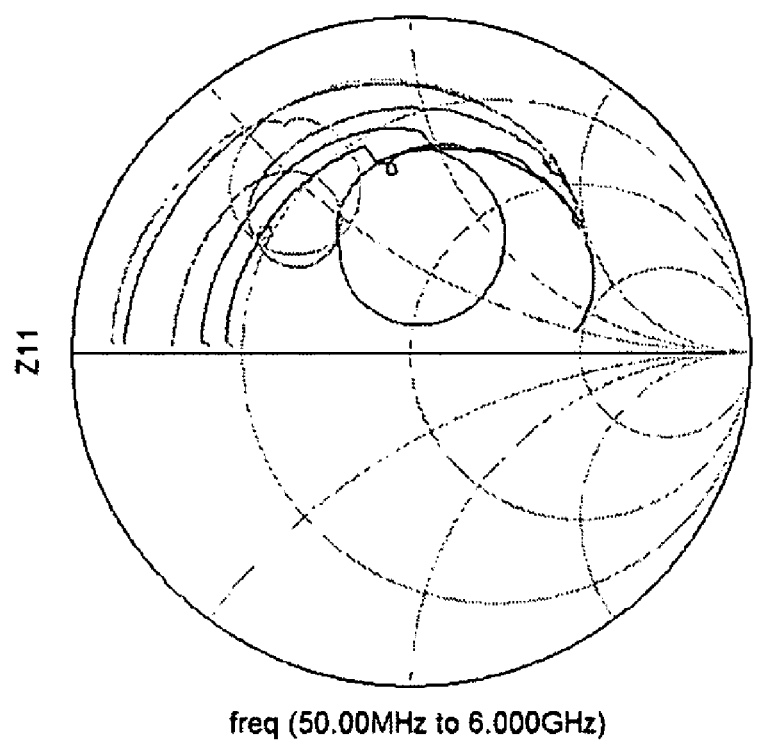
FIG. 24 shows the Smith chart of the measured $S_{11}$.
Figure 25:
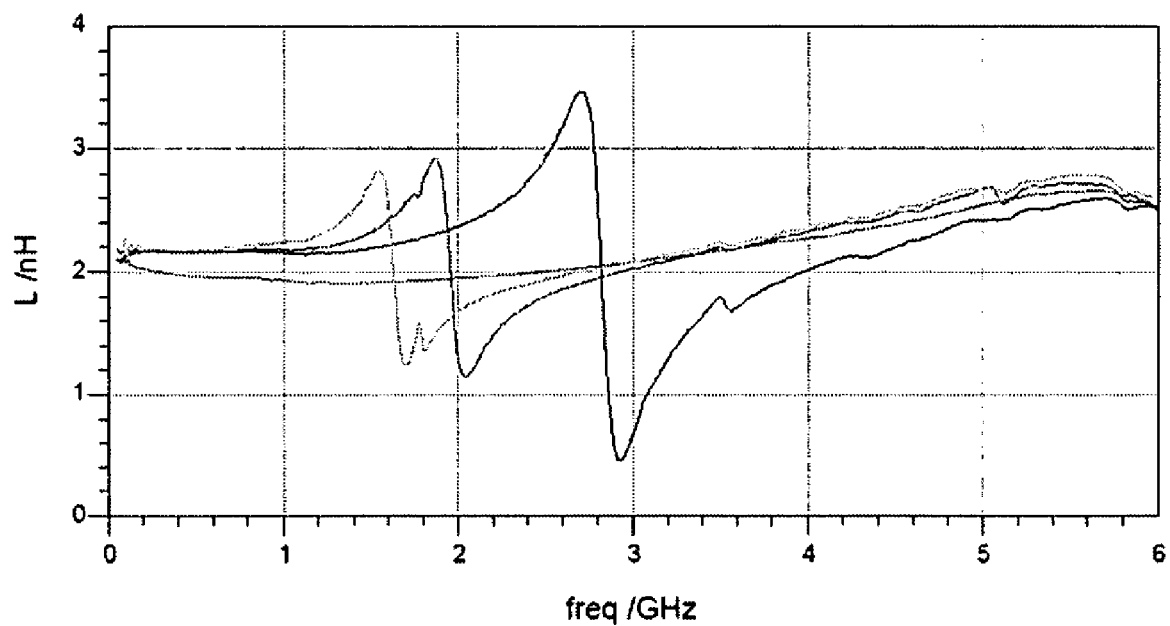
FIG. 25 shows the measured equivalent inductance with different off-chip capacitors.

A network analyzer, 8720ES, is used to measure the S-parameters of the invention when the capacitor is changed from 0.47 pF to 3.3 pF. $S_{11}$ is then converted to $Z_{11}$. The Smith chart of the measured $S_{11}$ and the corresponding plot of the equivalent inductance against frequency with different values of off-chip capacitor are shown in FIGS. 24 and 25 respectively.

It is important to notice that the self-resonant frequency of surface-mount capacitor is around 6 GHz. The performance of the embodiment of the invention using this setup is, therefore, limited to frequency around 6 GHz. In the measurement results, the data points at frequency larger than 6 GHz is not reliable. Yet, the data points below 6 GHz already demonstrate the change of inductance with the off-chip capacitors.

Figure 26:
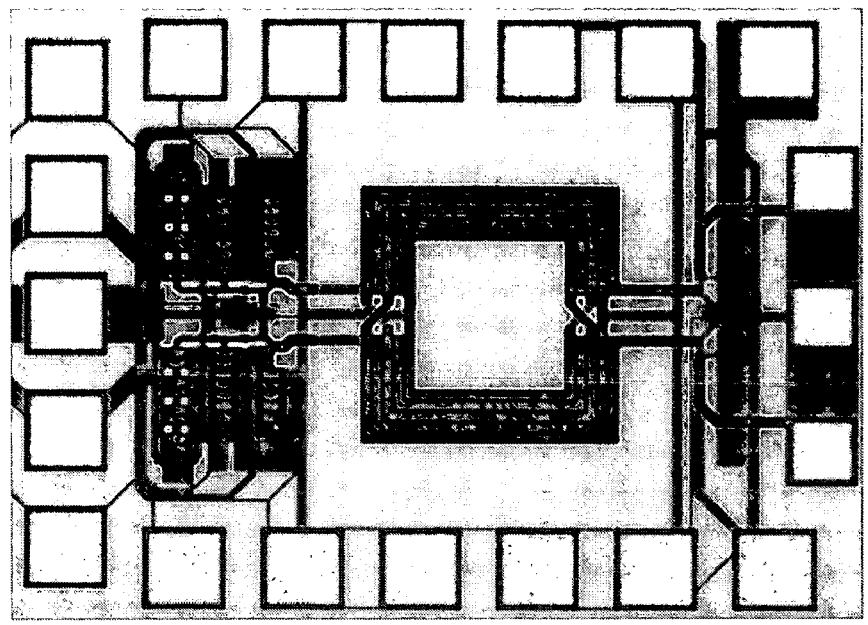
FIG. 26 is a die photo of a VCO formed according to an embodiment of the invention.
Figure 27:
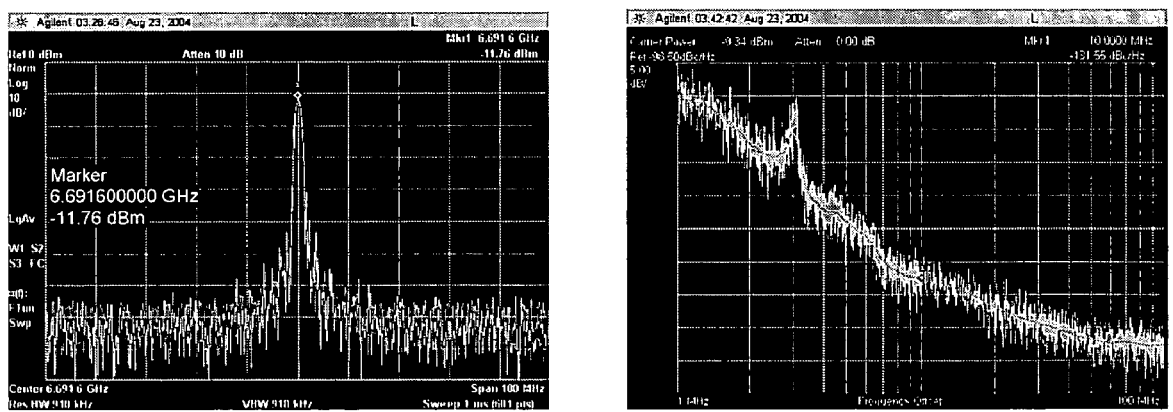
FIG. 27 shows the frequency spectrum and phase noise at the output of the VCO with the first-mode of oscillation.
Figure 28:
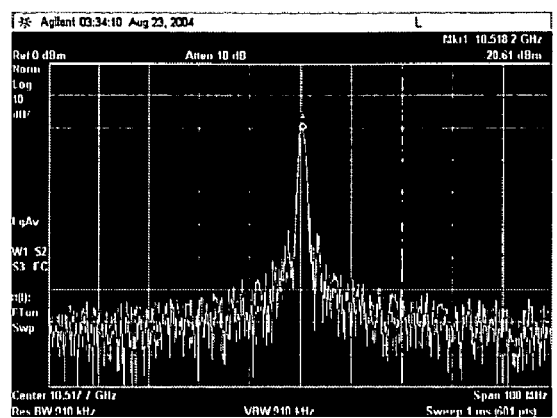
FIG. 28 shows the frequency spectrum and phase noise at the output of the VCO with the second-mode of oscillation.
Figure 28:
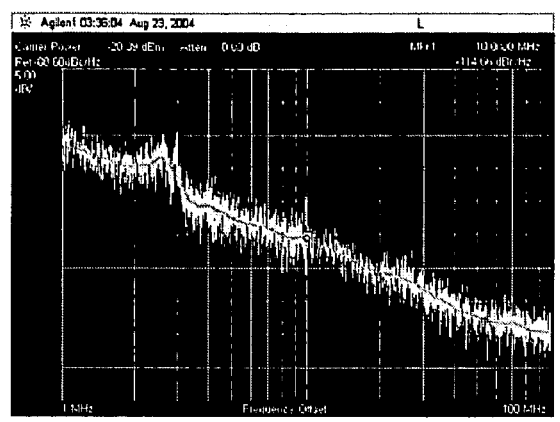

The third experiment is done through a VCO utilizing the present invention, which is fabricated using TSMC 0.18 μm CMOS technology. The resonator of the VCO composes of an on-chip 4-port transformer and on-chip switched capacitor array. By switching the SCA, the output frequency of the VCO can be adjusted. Its schematic is similar to the one shown in FIG. 16 and its die photo with DC bias connected using bondwires is shown in FIG. 26. On-chip measurement was done using high-speed SGS. It is found that by increasing the capacitance to 5 pF at the secondary coil using SCA, the output frequency can be changed from 6.71 GHz to 10.49 GHz. In conventional design, increasing the capacitance of a resonator can only reduce the oscillation frequency. In this design, which utilizes the present invention, increasing the capacitance to a particular value switches the oscillation from the first mode to the second one. The frequency spectrum and the phase noise plots at the output of the VCO are shown in FIG. 27 and FIG. 28. The performance of the VCO is summarized in Table 2. This fabricated VCO verifies the existence of a second oscillation mode inherent in the present invention and successfully demonstrates the switching mechanism of the different oscillation modes.

TABLE 2

Summary of the performance of the fabricated VCO

| Frequency/ GHz | $C_2$/pF | Output power/dBm | Phase noise | $V_{supply}$/V | Power/mW |
| --- | --- | --- | --- | --- | --- |
| 6.69 | 0 | −11.76 | −131.55 | 1 | 3.30 |
| 10.52 | 3.366 | −20.61 | −114.66 | 1 | 4.17 |

It will thus be seen that in preferred embodiments of the invention, together with its own parasitic capacitance the primary coil will resonate at different frequencies which are determined by the value of the capacitance at the secondary coil. By connecting another varactor at the primary coil, the frequency tuning range can be further extended to be much larger than that can be achieved with existing solutions with variable capacitors. It has also been shown by theory, simulation, and experiments that there exist two different resonant modes associated with the proposed variable inductor. The tuning range of the invention can be greatly increased by combining the two modes. Since embodiments of the invention are only composed of passive components, power consumption is low.

Resonators with very wide tuning range can then be implemented with embodiments of the invention and used in different applications. As an example, conventional LC oscillators have limited frequency tuning range and limited performance in phase noise and power consumption, in particular at high frequencies and low supply voltage, mainly because of the varactor requirement. With the proposed variable inductor, the capacitor can be fixed and be small so that all the parameters including frequency tuning range, phase noise, and power consumption, can be greatly improved. The invention has been applied to a VCO to achieve wide frequency tuning range and high performance that are not achievable with existing technologies.

The invention claimed is:

1. A dual-mode voltage controlled oscillator including a dual-mode variable inductor comprising a transformer having a primary coil and a secondary coil, wherein a variable capacitance is provided in parallel to said secondary coil and a fixed capacitor or a variable capacitor is provided in parallel with the primary coil; and a negative gm cell connected to said primary coil for cancellation of a loss in the variable inductor, wherein, by changing the variable capacitance in parallel with the secondary coil of the transformer, a resonant frequency of the dual-mode voltage controlled oscillator changes from a from a first frequency mode to a second frequency mode.

2. The voltage controlled oscillator as claimed in claim 1 wherein said variable capacitance provided in parallel with said secondary coil comprises a varactor.

3. The voltage controlled oscillator as claimed in claim 1 wherein said variable capacitance provided in parallel with said secondary coil comprises a switched capacitor array.

4. The voltage controlled oscillator as claimed in claim 1 wherein said primary coil and said secondary coil are coupled together by a mutual inductance.

5. The voltage controlled oscillator as claimed in claim 1 wherein a second negative gm cell is connected to the secondary coil.

6. The voltage controlled oscillator as claimed in claim 1 wherein a coupling enhancement circuit is connected to the secondary coil.

7. The voltage controlled oscillator as claimed in claim 1 wherein transformer feedback from a drain of a transistor to a source of the transistor is used to enhance the oscillation.

8. The voltage controlled oscillator as claimed in claim 1 wherein transformer feedback from a gate of a transistor to a source of the transistor is used to enhance the oscillation.

* * * * *